(12) United States Patent
Akeyama et al.

(10) Patent No.: US 7,034,626 B2
(45) Date of Patent: Apr. 25, 2006

(54) OSCILLATOR WITH CLOSED SERIES OF FOUR INDUCTORS AND FOUR CAPACITORS WITH CONNECTING NODES

(75) Inventors: Koichi Akeyama, Chiba (JP); Peter Vancorenland, Weerde (BE)

(73) Assignee: Kawasaki Microelectronics, Inc., Chiba (JP)

( * ) Notice: Subject to any disclaimer, the term of this patent is extended or adjusted under 35 U.S.C. 154(b) by 31 days.

(21) Appl. No.: 10/250,426

(22) PCT Filed: Jan. 8, 2002

(86) PCT No.: PCT/JP02/00015

§ 371 (c)(1),
(2), (4) Date: Oct. 31, 2003

(87) PCT Pub. No.: WO02/056456

PCT Pub. Date: Jul. 18, 2002

(65) Prior Publication Data

US 2004/0061563 A1    Apr. 1, 2004

(30) Foreign Application Priority Data

Jan. 10, 2001    (JP) .............................. 2001-002149

(51) Int. Cl.
*H03B 1/00*    (2006.01)

(52) U.S. Cl. ........................... 331/117 FE; 331/117 R; 331/167; 331/57

(58) Field of Classification Search ............ 331/177 V, 331/117 R, 167, 34, 117 FE, 57
See application file for complete search history.

(56) References Cited

U.S. PATENT DOCUMENTS

| 2,556,296 | A | 6/1951 | Rack |
| 5,629,652 | A | 5/1997 | Weiss |
| 6,417,737 | B1 * | 7/2002 | Moloudi et al. ............ 330/301 |
| 6,803,829 | B1 * | 10/2004 | Duncan et al. ................ 331/34 |

FOREIGN PATENT DOCUMENTS

| JP | A 10-126120 | 5/1998 |
| JP | A 11-8357 | 1/1999 |
| JP | A 11-126873 | 5/1999 |
| JP | 2000-77610 | 3/2000 |
| JP | A 2000-77610 | 3/2000 |
| JP | A 2000-138530 | 5/2000 |

OTHER PUBLICATIONS

Shojiro Nakahara et al., "Shuchu Teisuka 4GHz Branch Line Coupler", The Institute of Electronics, Infromation and Communication Engineers Zenkoku Takai Koen Ronbun Shu 3, Mar. 6, 1972, p. 721, lines 10-12, Figure 3.

(Continued)

*Primary Examiner*—Arnold Kinkead
(74) *Attorney, Agent, or Firm*—Oliff & Berridge, PLC (57) ABSTRACT

An object of the present invention is to provide an oscillator contributing to a reduction of power dissipation. An oscillator 10 comprises four inductors 11_1, 11_3, 11_2, and 11_4 connected in series to constitute a closed circuit, and four capacitors 12_1, 12_3, 12_2, and 12_4 one ends of which are connected to nodes that are connecting points of the inductors, and another ends of which are held at a power supply $V_{DD}$. The oscillator 10 is formed on a semiconductor substrate.

5 Claims, 7 Drawing Sheets

OTHER PUBLICATIONS

Chi-Wa Lo et al., "2-V 900-MHz quadrature coupled LC oscillators with improved amplitude and phase matchings." Circuits and Systems 1999. ISCAS '99 Proceedings to the 1999 IEEE International Symposium on vol. 2, pp. 585-588, Fig 1.

Setou et al., "Control of Phase States in Ring Oscillators Sharing Inductors," pp. 813-816, 1997 IEEE International Symposium on Circuits and Systems, Jun. 9-12, 1997, Hong Kong.

* cited by examiner

OSCILLATOR WITH CLOSED SERIES OF FOUR INDUCTORS AND FOUR CAPACITORS WITH CONNECTING NODES

TECHNICAL FIELD

The present invention relates to an oscillator.

BACKGROUND ART

Hitherto, in order to contribute to miniaturization of portable equipment and achieving low power dissipation of the portable equipment, an oscillator is not mounted on the portable equipment as an independent part, and is formed on a substrate of a semiconductor device provided on the portable equipment together with other functional parts.

Figure 6:
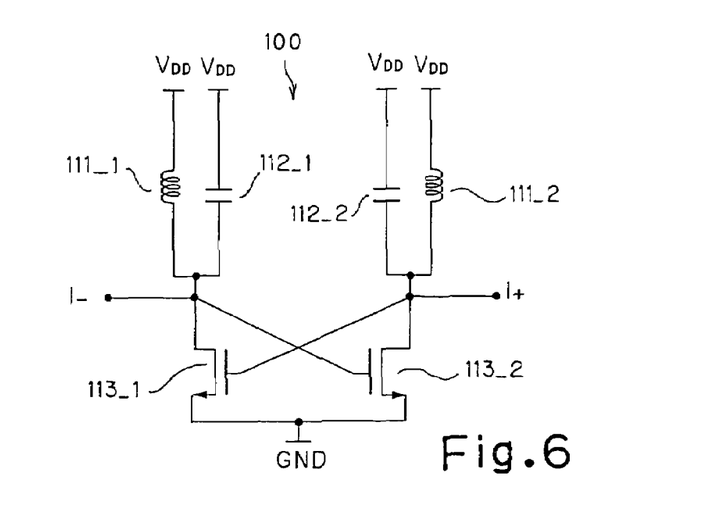
FIG. 6 is a circuit diagram of a differential oscillator formed on a semiconductor substrate as the conventional one.

FIG. 6 is a circuit diagram of a differential oscillator formed on a semiconductor substrate as the conventional one.

A differential oscillator 100 shown in FIG. 6 has a first LC tank comprising an inductor 111_1 and a capacitor 112_1 one terminals of which are connected to a power supply $V_{DD}$ on a common basis and another terminals are connected to one another, and a second LC tank comprising an inductor 111_2 and a capacitor 112_2 one terminals of which are connected to a power supply $V_{DD}$ on a common basis and another terminals are connected to one another. The differential oscillator 100 further has an NMOS transistor 113_1 disposed between the connecting point of the inductor 111_1 and the capacitor 112_1 and the ground GND, and an NMOS transistor 113_2 disposed between the connecting point of the inductor 111_2 and the capacitor 112_2 and the ground GND. A gate of the NMOS transistor 113_1 is connected to the connecting point of the inductor 111_2 and the capacitor 112_2. A gate of the NMOS transistor 113_2 is connected to the connecting point of the inductor 111_1 and the capacitor 112_1.

In the differential oscillator 100, the first LC tank and the second LC tank are connected with the NMOS transistor 113_2 and the NMOS transistor 113_1 on a cross-coupling basis. Thus the differential oscillator 100 outputs oscillation signals $I_-$, $I_+$, which are mutually shifted by 180° in phase. The NMOS transistors 113_1 and 113_2 compensate for energy loss due to parasitic resistances of the inductors 111_1 and 111_2, and have sufficient gains for compensating for the energy loss. As a method of forming the inductors 111_1 and 111_2, there are proposed various forming methods. In the differential oscillator 100, the inductors 111_1 and 111_2 are formed on a silicon substrate using a standard process of CMOS. This brings about such an advantage that the manufacturing cost is inexpensive.

Figure 7:
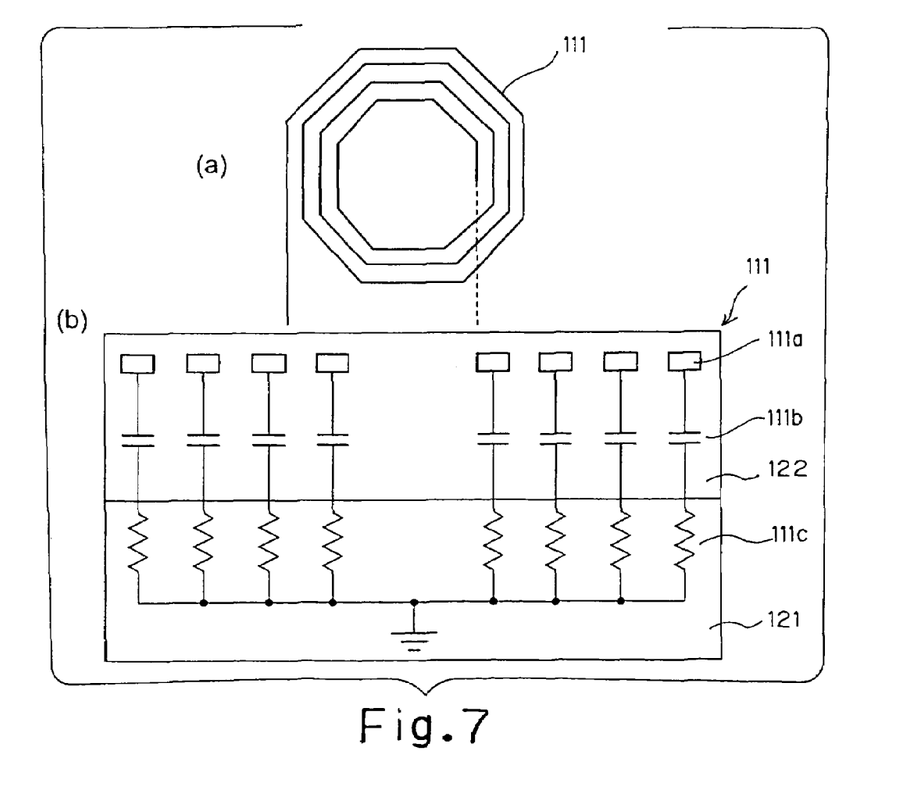
FIG. 7 is a view showing an inductor formed on a silicon substrate of the differential oscillator shown in FIG. 6.

FIG. 7 is a view showing an inductor formed on a silicon substrate.

While FIG. 6 shows two inductors 111_1 and 111_2, FIG. 7 shows typically one of the two inductors 111_1 and 111_2 (which is referred to as an inductor 111).

Part (a) of FIG. 7 shows a top view of a helical inductor (an on-chip inductor) 111. Part (b) of FIG. 7 shows a sectional view of the inductor 111. As shown in the part (b) of FIG. 7, the inductor 111 is formed in such a manner that a helical conductor pattern 111a is disposed in an insulating layer 122 provided on a silicon substrate 121. The inductor 111 thus formed has a resistive component Rl involved in the helical conductor pattern 111a. Between the conductor pattern 111a and the silicon substrate 121, there exist capacitors 111b having parasitic capacitance $C_s$. On the silicon substrate 121, there exist substrate resistances 111c having resistance $R_s$.

The use of varactors or the like, which is a device having a so-called voltage control variable capacitance wherein a capacitance is varied in accordance with an applying voltage, as the capacitors 112_1 and 112_2 constituting the differential oscillator 100, makes it possible to implement a voltage controlled oscillator (VCO) for outputting an oscillation signal of an oscillation frequency according to a control voltage. While FIG. 6 shows an arrangement in which the one ends of the capacitors 112_1 and 112_2 are connected to the power supply $V_{DD}$, in case of the voltage controlled oscillator, it is acceptable that the one ends of the capacitors 112_1 and 112_2 are connected to a terminal of a variable capacitance control signal.

Figure 8:
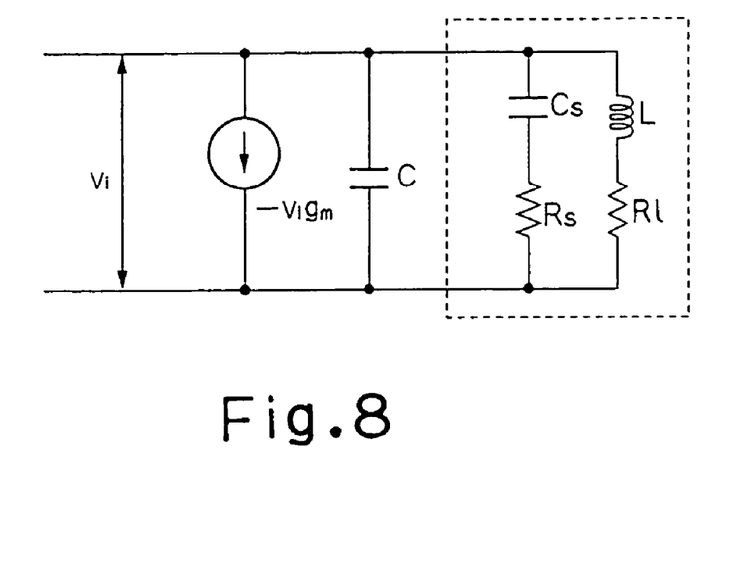
FIG. 8 shows a small signal equivalent circuit of the differential oscillator shown in FIG. 6.

FIG. 8 shows a small signal equivalent circuit to the oscillation signal $I_+$ shown in FIG. 6.

In FIG. 8, $v_i$ denotes a small signal potential of the oscillation signal $I_+$. The small signal equivalent circuit is expressed by a small signal current $-v_i\, g_m$ generated by the gain $g_m$ when the oscillation signal $I_-$ is applied to a gate of the NMOS transistor 113_1, a capacitance C of the varactor, and an inductor encircled by a broken line, which comprises an inductance L, a resistance component Rl, a parasitic capacitance $C_s$, and a substrate resistance $R_s$. In case of the voltage controlled oscillator, in order to expand the range of the variable frequency, there is a need to maintain a capacitance other than the capacitance of the varactor small as much as possible. From this viewpoint it is important that the parasitic capacitance $C_s$ is given with a small value as much as possible. In the event that the voltage controlled oscillator shown in FIG. 8 is used to perform an oscillation of a high frequency, setting up the resistance $R_s$ of the silicon substrate disposed at the lower portion of the inductor to be large makes it possible to keep the influence of the parasitic capacitance $C_s$ on the oscillation frequency small. In the event that the resistance $R_s$ of the silicon substrate is sufficiently large, the equivalent circuit shown in FIG. 8 can be approximately replaced by an equivalent circuit shown in FIG. 9.

Figure 9:
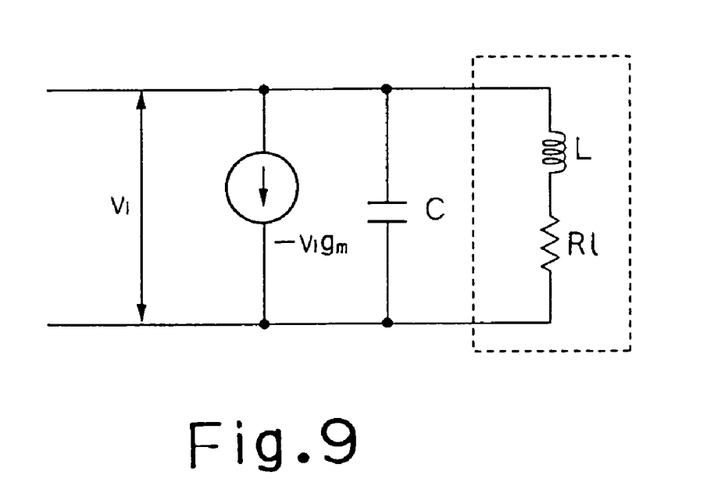
FIG. 9 is a view showing the equivalent circuit of the oscillator shown in FIG. 8 in the event that the resistance of the silicon substrate is sufficiently high.

FIG. 9 is a view showing the equivalent circuit of the voltage controlled oscillator shown in FIG. 8 in the event that the resistance of the silicon substrate is sufficiently high.

According to the equivalent circuit of FIG. 9, the lower resistance component Rl of the inductor, the more it is possible to reduce the current necessary for the oscillation. Generally it is considered that the current necessary for the oscillation is proportional to a gain $g_s$ of a transistor necessary for the oscillation. Here, the gain $g_s$ of the transistor necessary for the oscillation is expressed by $$g_m > (1/R_p) \quad (1)$$

where $R_p$ is expressed by $$R_p = Rl(1+Q^2) \quad (2)$$

Where Q is expressed by $$Q = (\omega_0 L/Rl) \quad (3)$$

Where the oscillation frequency $\omega_0$ is expressed by $$\omega_0 = (1/LC)^{1/2} \quad (4)$$

Recently, as the radio communication transceiver technology developed, there is mounting necessity of an oscillator (a quadrature oscillator) for outputting two oscillation signals (those are referred to as I signal and Q signal) which are several GHz levels of high frequency and mutually shifted by 90 degrees in phase. Such an oscillator is incorporated into for example a down conversion section of a receiver, and is used as an image signal processor when a high frequency of radio signal is converted into a low frequency of radio signal.

Figure 10:
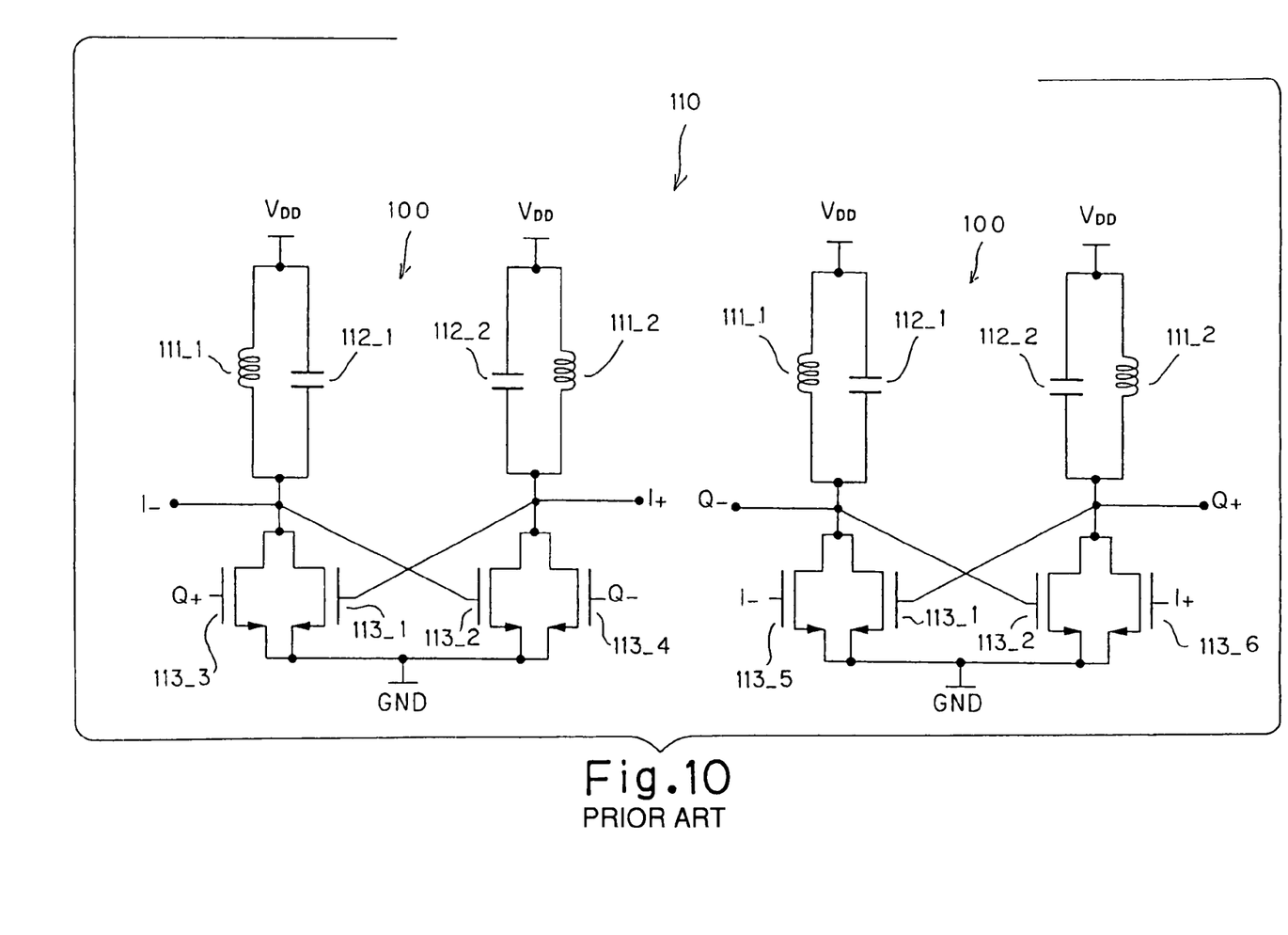
FIG. 10 is a view showing the conventional quadrature oscillator.

FIG. 10 is a view showing the conventional quadrature oscillator.

A quadrature oscillator 110 shown in FIG. 10 is proposed in the publication "IEEE J. of Solid-State Circuits, April 1998 . . . Part 1; Architecture & Transmitter". The quadrature oscillator 110 is provided with two differential oscillators 100 shown in FIG. 6. There are provided NMOS transistors 113_3 and 113_4 in parallel with NMOS transistors 113_1 and 113_2, respectively, which constitute the left side one of the two differential oscillators 100. Further, there are provided NMOS transistors 113_5 and 113_6 in parallel with NMOS transistors 113_1 and 113_2, respectively, which constitute the right side one of the two differential oscillators 100. Gates of the NMOS transistors 113_3 and 113_4 are connected to gates of the NMOS transistors 113_1 and 113_2, respectively, which constitute the right side one of the two differential oscillators 100. Gates of the NMOS transistors 113_5 and 113_6 are connected to gates of the NMOS transistors 113_2 and 113_1, respectively, which constitute the left side one of the two differential oscillators 100. The NMOS transistors 113_1 and 113_2 are each referred to as a differential type of loss compensating transistor. The NMOS transistors 113_3, 113_4, 113_5 and 113_6 are each referred to as a quadrature phase holding transistor. Voltages $V(Q_+)$, $V(Q_-)$, $V(I_+)$, and $V(I_-)$, which are represented by signals $Q_+$, $Q_-$, $I_+$, and $I_-$ of the quadrature oscillator 110, respectively, are voltages which are mutually shifted by 90 degrees in phase as set forth below.

$$V(Q_+) = jV(I_+)$$

$$V(I_-) = -V(I_+)$$

$$V(Q_-) = -jV(I_+)$$

Figure 11:
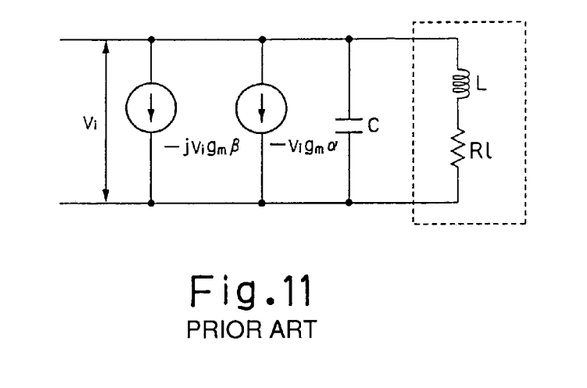
FIG. 11 is a view showing a small signal equivalent circuit of the quadrature oscillator shown in FIG. 10.

FIG. 11 is a view showing a small signal equivalent circuit of the quadrature oscillator shown in FIG. 10 for the oscillation signal $I_+$.

The small signal equivalent circuit is expressed by a small signal potential $v_i$ of the oscillation signal $I_+$, a small signal current $-v_i \, g_m$ á generated by the gain $g_m$ á when the oscillation signal $I_-$ is applied to a gate of the differential type of loss compensating transistor, a small signal current $-jv_i \, g_m \, \beta$ generated by the gain $g_m \, \beta$ when the oscillation signal $Q_-$ is applied to a gate of the quadrature phase holding transistor, a capacitance C of the capacitor, and an inductor having an inductance L and a resistance component Rl. Incidentally, since the resistance $R_s$ of the substrate disposed at the lower portion of the inductor is sufficiently high, the parasitic capacitance $C_s$ and the substrate resistance $R_s$ are omitted.

From this small signal equivalent circuit, the approximately same solution as the case of the above-mentioned differential oscillator 100 can be obtained.

$$g_m > (1/R_p) \quad (5)$$

$$R_p = Rl(1+Q^2) \quad (6)$$

$$Q = (\omega_0 L/Rl) \quad (7)$$

$$\omega_0 = (1/LC)^{1/2} \quad (8)$$

As mentioned above, the oscillation frequency $\omega_0$ is expressed by $$\omega_0 = (1/LC)^{1/2},$$

as given by equation (8), where the quadrature oscillator 110 is driven by a small signal. In order to obtain a desired oscillation frequency $\omega_0$, an inductor having an inductance L which reflects the oscillation frequency $\omega_0$ is used. However, since the parasitic resistance component is involved in the inductor, there is a need to maintain the oscillation by flowing a current of the amount which reflects the parasitic resistance component. Thus, in the oscillator, an influence of the parasitic resistance component involved in the inductor upon the current necessary for maintaining the oscillation is large, and there is a problem with respect to reduction of the power dissipation of the oscillator.

DISCLOSURE OF THE INVENTION

In view of the foregoing, it is an object of the present invention to provide an oscillator capable of reduction of the power dissipation.

To achieve the above-mentioned object, the present invention provides an oscillator comprising four inductors connected in series to constitute a closed circuit, and four capacitors one ends of which are connected to nodes that are connecting points of the inductors, and another ends of which are held at a DC potential. Incidentally, while it is acceptable that those another ends of the four capacitors are held at the same DC potential, there is no need to do so. It is acceptable that those another ends are held at the individual DC potentials. In case of the voltage controlled oscillator, while the variable capacitor is used, it is acceptable that the DC potential to be connected to the capacitors is replaced by a variable capacitance control signal.

The oscillator of the present invention comprises the above-mentioned four inductors and the above-mentioned four capacitors. Thus, as will be described in the embodiments of the present invention latter, according to the oscillator of the present invention, it is possible to oscillate at the same oscillation frequency as that of the conventional oscillator by the inductors having inductance values larger than that of inductors constituting the conventional oscillator. The use of the inductors having the larger inductance values makes it possible to reduce the effective parasitic resistance component. Thus, it is possible to keep the current for maintaining the oscillation small and thereby reduce the power dissipation.

In the oscillator according to the present invention as mentioned above, it is preferable that the oscillator is formed on a semiconductor substrate.

In the oscillator according to the present invention as mentioned above, it is preferable that the inductors are formed with a layer of conductor or a plurality of layers of conductors formed on the semiconductor substrate.

Specifically, in the event that the inductors are formed with a plurality of layers of conductors, it is possible to form the inductors wherein the parasitic resistance component is reduced, whereby the power dissipation is more reduced.

In the oscillator according to the present invention as mentioned above, the oscillator further comprises differential type of loss compensating transistors and phase holding transistors on the respective nodes. This feature makes it possible to contribute to a stabilization of the oscillation and also to maintain the phase difference.

In the oscillator according to the present invention as mentioned above, the capacitors are varied in their capacitance in accordance with a control signal, so that an oscillation frequency of the oscillator is controlled in accordance with variations of their capacitance.

This feature makes it possible to form a voltage controlled oscillator (VCO).

In the oscillator according to the present invention as mentioned above, it is acceptable that one ends of the capacitors, which are varied in their capacitance in accordance with the control signal, are connected to nodes that are connecting points of the inductors, and another ends of the capacitors are connected to a signal for controlling the capacitance.

Further, in oscillator according to the present invention as mentioned above, it is acceptable that an area below at least the inductors of the semiconductor substrate is set up to be higher in a substrate resistance as compared with areas other than the area.

This feature makes it possible to reduce the energy loss wherein oscillation current at a high frequency flows through the semiconductor substrate.

In the oscillator according to the present invention as mentioned above, it is acceptable that a shallow-trench isolation is embedded in the area below at least the inductors of the semiconductor substrate.

This feature makes it possible to keep the parasitic capacitance between the inductors and the semiconductor substrate.

In the oscillator according to the present invention as mentioned above, it is acceptable that the shallow-trench isolation is shaped as a lattice.

This feature makes it possible to block the current on a surface of the semiconductor substrate, and thereby enhancing the substrate resistance value.

In the oscillator according to the present invention as mentioned above, it is acceptable that an area just below at least the inductors of said semiconductor substrate is formed by blocking an injection of impurities.

This feature makes it possible to enhance resistivity of the semiconductor substrate.

BEST MODE FOR CARRYING OUT THE INVENTION

Embodiments of the present invention will be described hereinafter.

Figure 1:
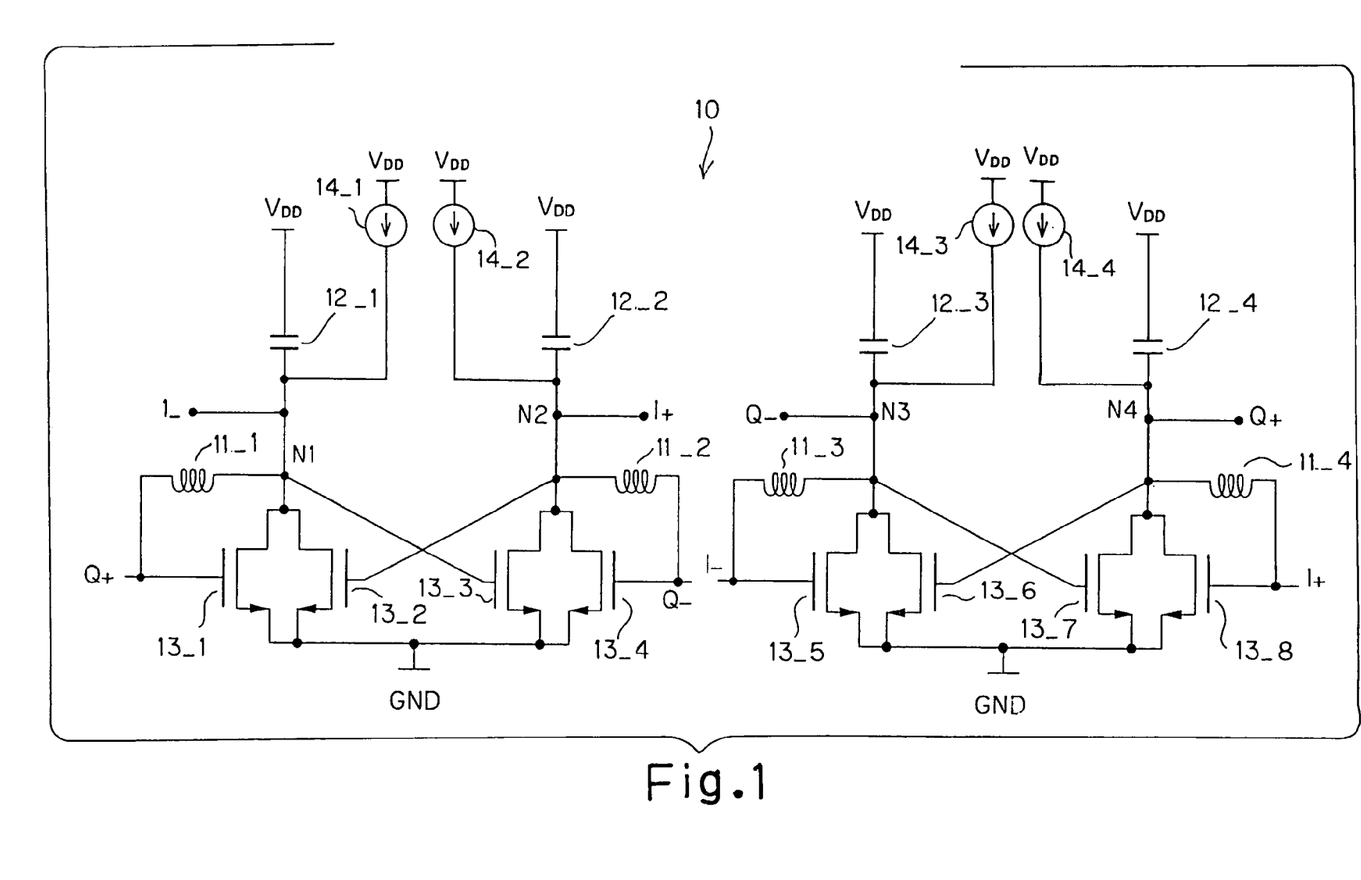
FIG. 1 is a circuit diagram of an oscillator according to an embodiment of the present invention.

FIG. 1 is a circuit diagram of an oscillator according to an embodiment of the present invention.

A quadrature oscillator (hereinafter it will be simply referred to as an oscillator) 10 shown in FIG. 1 comprises capacitors 12_1, 12_2, 12_3, and 12_4, one ends of which are connected to a power supply $V_{DD}$ on a common basis, and inductors 11_1, 11_2, 11_3, and 11_4, one ends of which are connected to nodes N1, N2, N3, and N4, respectively, that are another ends of the capacitors 12_1, 12_2, 12_3, and 12_4, respectively.

The oscillator 10 further comprises NMOS transistors 13_2, 13_3, 13_6 and 13_7 (corresponding to the differential type of loss compensating transistors referred to in the present invention), and NMOS transistors 13_1, 13_4, 13_5 and 13_8 (corresponding to the phase holding transistors referred to in the present invention), which are provided between the nodes N1, N2, N3 and N4 and the ground GND, respectively. Gates of the NMOS transistors 13_1, 13_4, 13_5 and 13_8 are connected to another ends of the inductors 11_1, 11_2, 11_3 and 11_4, respectively. Gates of the NMOS transistors 13_2, 13_3, 13_6 and 13_7 are connected to the nodes N1, N2, N3 and N4 (on a cross coupling connection basis). Further, the node N1 is connected to the gate of the NMOS transistor 13_5, and the node N2 is connected to the gate of the NMOS transistor 13_8. The node N3 is connected to the gate of the NMOS transistor 13_4, and the node N4 is connected to the gate of the NMOS transistor 13_1.

The NMOS transistors 13_2, 13_3, 13_6 and 13_7 serve to compensate for energy loss due to parasitic resistances and the like involved in the inductors 11_1, 11_2, 11_3 and 11_4, respectively. The NMOS transistors 13_2 and 13_3 serve to maintain signals $I_+$, $I_-$ of the oscillator 10 to mutually shift in phase by 180 degrees. The NMOS transistors 13_6 and 13_7 serve to mutually shift the signals $Q_+$, $Q_-$ of the oscillator 10 in phase by 180 degrees. The NMOS transistors 13_1, 13_4, 13_5 and 13_8 serve to maintain the signals $I_+$, $I_-$, $Q_+$, $Q_-$ of the oscillator 10 to mutually shift in phase by 90 degrees. Between the nodes N1, N2, N3 and N4 and the power supply $V_{DD}$, constant current supplies 14_1, 14_2, 14_3 and 14_5 are connected, respectively. Incidentally, when the oscillation frequency is controlled using varactors varying in capacitance in accordance with a control signal voltage, as the capacitors 12_1, 12_2, 12_3 and 12_4, respectively, there is obtained a voltage controlled oscillator (VCO).

Next, aspects of the oscillator 10 according to the present embodiment will be explained in conjunction with FIG. 2 and FIG. 3.

Figure 2:
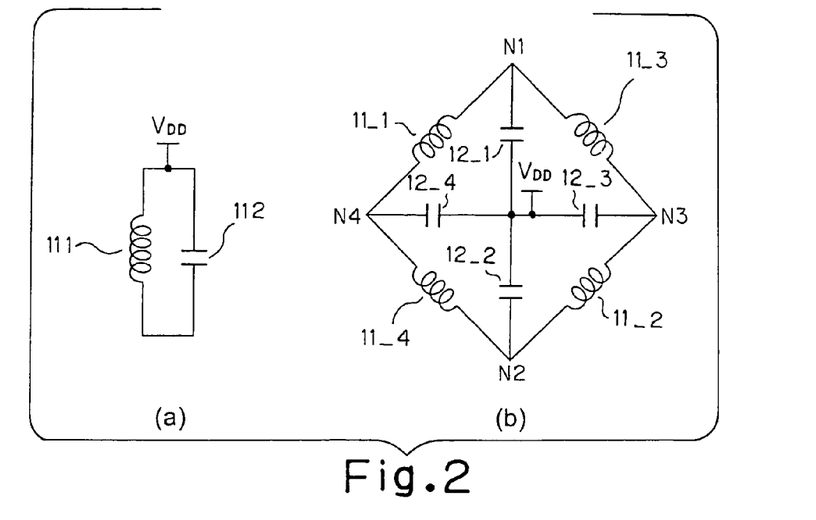
FIG. 2 is a comparison diagram of an equivalent circuit of an LC tank of the conventional oscillator and an equivalent circuit of an LC tank of the oscillator shown in FIG. 1.

FIG. 2 is a comparison diagram of an equivalent circuit of an LC tank of the conventional oscillator and an equivalent circuit of an LC tank of the oscillator shown in FIG. 1.

The LC tank of the conventional oscillator comprises, as shown in part (a) of FIG. 2, an inductor 111 and a capacitance 112 one ends of which are connected to a power supply $V_{DD}$ on a common basis, and another ends are connected to one another. On the other hand, the oscillator 10 of the present embodiment comprises, as shown in part (b) of FIG. 2, four inductors 11_1, 11_3, 11_2 and 11_4 connected in series to constitute a closed circuit, and four capacitors 12_1, 12_3, 12_2 and 12_4, one ends of which are connected to nodes N1, N3, N2, and N4, respectively, that are connection points of the above-mentioned inductors, and another ends are connected to the power supply $V_{DD}$.

Figure 3:
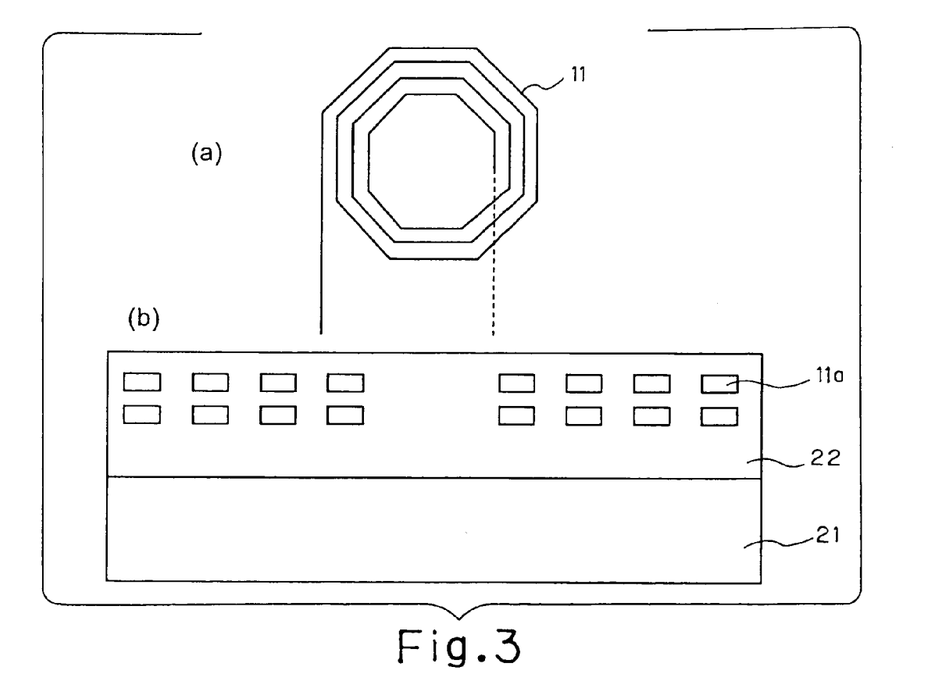
FIG. 3 is an illustration of an inductor formed on a silicon substrate of the oscillator shown in FIG. 1.

FIG. 3 is an illustration of an inductor formed on a silicon substrate of the oscillator shown in FIG. 1.

Incidentally, while FIG. 1 shows the four inductors 11_1, 11_2, 11_3 and 11_4, FIG. 3 representatively shows one (referred to as an inductor 11) of the four inductors 11_1, 11_2, 11_3 and 11_4.

Part (a) of FIG. 3 shows a top view of the spiral inductor 11. Part (b) of FIG. 3 shows a sectional view of the spiral inductor 11. The spiral inductor 11 is formed, as shown in the part (b) of FIG. 3, in an insulating layer 22 provided on a silicon substrate 21 with two layers of conductor pattern 11a.

An area below at least the inductor 11 of the silicon substrate 21 is set up to be higher in a substrate resistance as compared with areas other than the area. Specifically, a shallow-trench isolation is embedded in the area below at least the inductor 11 of the silicon substrate 21. In this manner, embedding the shallow-trench isolation in the area below at least the inductor 11 makes it possible to keep the parasitic capacitance between the inductor 11 and the silicon substrate 21 to be small. The shallow-trench isolation is shaped as a lattice. In this manner, shaping the shallow-trench isolation as a lattice may block a current on a surface of the silicon substrate 11, and thereby enhancing a resistance of the silicon substrate 21. Further, this feature makes it possible to expect an effect that winding of the silicon substrate 21 is reduced.

It is acceptable that the area just below at least the inductor 11 of the silicon substrate 21 is formed by blocking an injection of impurities. In this manner, it is acceptable that a resistivity of the silicon substrate 21 is enhanced. It is acceptable that the shallow-trench isolation is embedded in the area below the inductor 11 in its entirety.

Such a technique that the shallow-trench isolation is embedded in the area below the inductor 11 in its entirety; the shallow-trench isolation is shaped as a lattice; and the area just below at least the inductor 11 of the silicon substrate 21 is formed by blocking an injection of impurities, as mentioned above, needs no additional mask. Thus, this technique imposes no burden on a cost and is very effective on an industrial basis.

Figure 4:
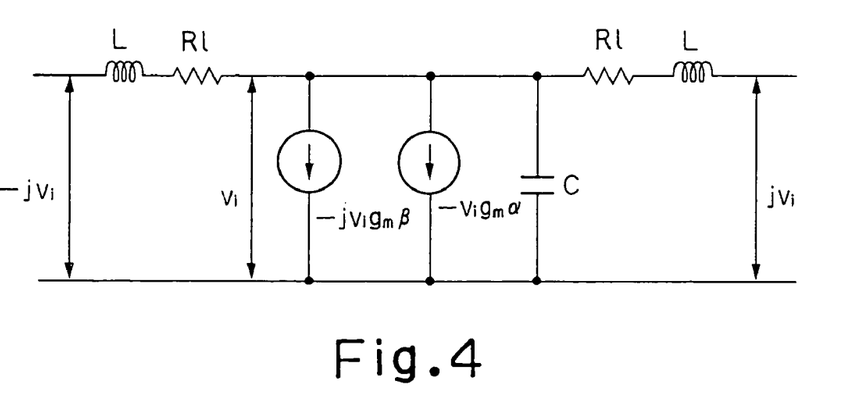
FIG. 4 is a diagram of a small signal equivalent circuit of the oscillator shown in FIG. 1.

FIG. 4 is a diagram of a small signal equivalent circuit of the oscillator shown in FIG. 1 to the oscillation signal $I_+$.

The small signal equivalent circuit shown in FIG. 4 is expressed by a small signal $v_i$ the oscillation signal $I_+$, a small signal current $-v_i g_m$ á generated by the gain $g_m$ á when the oscillation signal $I_-$ is applied to a gate of the differential type of loss compensating transistor, a small signal current $-jv_i g_m \beta$ generated by the gain $g_m \beta$ when the oscillation signal $Q_-$ is applied to a gate of the quadrature phase holding transistor, a capacitance C of the capacitor, and an inductor having an inductance L and a resistance component Rl. Incidentally, since the resistance $R_s$ of the substrate disposed at the lower portion of the inductor is sufficiently high, the substrate resistance $R_s$ and the parasitic capacitance $C_s$ are omitted. This equivalent circuit is equivalent to the small signal equivalent circuit shown in FIG. 5 with respect to the oscillation signal $I_+$.

Figure 5:
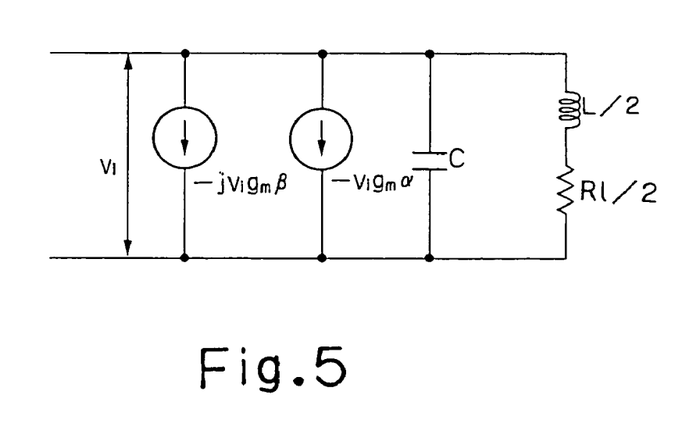
FIG. 5 is a diagram of a small signal equivalent circuit equivalent to the small signal equivalent circuit shown in FIG. 4 as to the oscillation signals $I_+$.

From this small signal equivalent circuit, the following solution can be obtained.

$$g_m > (1/R_p) \quad (9)$$

$$R_p = Rl(1+Q^2) \quad (10)$$

$$Q = (\omega_0 L/Rl) \quad (11)$$

$$\omega_0 = (2/LC)^{1/2} \quad (12)$$

Here, there will be described a difference between the present embodiment and the prior art. In the event that the quadrature oscillator is constructed using the same manufacturing technology, the same capacitor and the same inductor, the oscillation frequency $\omega_0$ in the conventional quadrature oscillator (cf. FIG. 10) is expressed by $$\omega_0 = (1/LC)^{1/2},$$

as given by equation (8).

On the other hand, the oscillation frequency $\omega_0$ in the quadrature oscillator 10 according to the present embodiment is expressed by $$\omega_0 = (2/LC)^{1/2},$$

as given by equation (12). In comparison of equation (8) with equation (12), the oscillation frequency in the present embodiment is 2 (square root of 2) times as high as the oscillation frequency in the prior art. The gain $g_m$ of the transistor, which is necessary for maintaining the oscillation, is equal to one another between the prior art and the present embodiment, as seen from the equation (5) and the equation (9).

Merits of the present embodiment are caused, as apparent from the comparison of equation (8) with equation (12), by the matter that according to the present embodiment, to implement the same oscillation frequency, it is possible to use an on-chip inductor that is twice in inductance as much as the prior art. In the event that the inductor 11 (cf. FIG. 3) is formed, as will be seen from the example set forth below, the use of the larger inductor in inductance (L) makes it possible to reduce the effective parasitic resistance component, and thereby reducing the power dissipation. Hereinafter, there will be described merits of the present embodiment referring to the example.

The L value and the parasitic resistance Rl of the inductor depend on the process technology and the layout pattern. According to a simulation for characteristics of an inductor using metal layers 2, 3 and 4 in parallel, but not using metal layer 1, based on a certain process, it is possible to produce an inductor of L=2.45 nH, Rl=1.9 Ω, where a radius is 100 um, a metal line width is 8 um, a metal-to-metal space is 1.2 um, and a winding number is 3. Assuming that a capacitance (C value) of the capacitor used in the oscillator is 5 pF (of course, while it is acceptable that a varactor is used, the C value is given with the constant value for the purpose of the comparison), according to the prior art, there is obtained from the equation (8) an oscillator oscillating at 1.44 GHz. The gain $g_m$ necessary at that time is given by the following expression from the equation (5).

$$g_m > 3.8 \text{ mA/V (prior art)}$$

Now let us consider that the oscillation frequency of the same 1.4 GHz is implemented in accordance with the present embodiment. Generally, in the event that the inductor shown in FIG. 3 is formed, an increment of the line width and the diameter of the metal makes it possible to obtain an inductor having a large L value involving no increment of the value of the Rl (rather it often happens that the value of the Rl is small). In this case, since the area of the inductor becomes large, the capacitance $C_s$ between the inductor and the semiconductor placed just below the inductor becomes large. However, if the value of the resistance of the substrate is sufficiently large, effects of parasitic capacitance $C_s$ on the oscillation frequency at the high frequency is small, and thus it is possible to neglect the effects. In the event that the same technology is used and there is used an inductor wherein a radius is 200 um, a metal line width is 16 um, a metal-to-metal space is 1.2 um, and a winding number is 3, it is possible to produce an inductor of L=4.9 nH, Rl=1.6 Ω. In a similar fashion to that of the prior art, assuming that a capacitance (C value) of the capacitor used in the oscillator is 5 pF, since the L value is twice, according to the present embodiment too, there is obtained from the equation (12) an oscillator oscillating at 1.44 GHz. The gain $g_m$ necessary at that time is given by the following expression from the equation (9).

$$g_m > 1.3 \text{ mA/V (present embodiment)}$$

As mentioned above, according to the present embodiment, it is possible to keep the gain $g_m$ necessary for the transistor ½ to ¼. It may be considered that the current amount necessary for maintaining the oscillation is proportional to the necessary gain $g_m$, and thus it is possible to reduce the power dissipation to ½ to ¼.

Incidentally, according to the present embodiment, there is explained an example in which the four capacitors constituting the oscillator are connected to the power supply $V_{DD}$. However, the present invention is not restricted to the present embodiment, and is acceptable that the four capacitors are connected to a DC potential.

In the event that a variable capacitor is used to form a voltage controlled oscillator, it is acceptable that the four capacitors are connected to a terminal for a capacitance control signal, but not the DC potential.

Further, according to the present embodiment, there is explained an example in which as the differential type of loss compensating transistor and the phase holding transistor, the NMOS transistor is used. However, it is acceptable that as those transistors, a PMOS transistor or a bipolar transistor is used.

What is claimed is:

1. An oscillator comprising:
    four inductors connected in series to constitute a closed circuit;
    four capacitors one ends of which are connected to nodes that are connecting points of said inductors, and another ends of which are held at a DC potential; and
    differential type of loss compensating transistors and phase holding transistors on the respective nodes.

2. An oscillator comprising:
    four inductors connected in series to constitute a closed circuit; and
    four capacitors one ends of which are connected to nodes that are connecting points of said inductors, and another ends of which are held at a DC potential,
    wherein said oscillator is formed on a semiconductor substrate and an area below at least the inductors of said semiconductor substrate is set up to be higher in a substrate resistance as compared with areas other than the area.

3. An oscillator according to claim 2, wherein a shallow-trench isolation is embedded in the area below at least the inductors of the semiconductor substrate.

4. An oscillator according to claim 3, wherein said shallow-trench isolation is shaped as a lattice.

5. An oscillator comprising:
    four inductors connected in series to constitute a closed circuit; and
    four capacitors one ends of which are connected to nodes that are connecting points of said inductors, and another ends of which are held at a DC potential,
    wherein said oscillator is formed on a semiconductor substrate and an area just below at least the inductors of said semiconductor substrate is formed by blocking an injection of impurities.

* * * * *